United States Patent
Liao

(10) Patent No.: US 10,211,078 B2
(45) Date of Patent: Feb. 19, 2019

(54) POSITION-DETECTING AND CHIP-SEPARATING DEVICE

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 0 days.

(21) Appl. No.: 15/865,343

(22) Filed: Jan. 9, 2018

(65) Prior Publication Data

US 2018/0286722 A1  Oct. 4, 2018

(30) Foreign Application Priority Data

Mar. 29, 2017 (TW) .............................. 106110517 A

(51) Int. Cl.
| | |
|---|---|
| *H01L 21/30* | (2006.01) |
| *H01L 21/67* | (2006.01) |
| *H01L 31/18* | (2006.01) |
| *H01L 33/26* | (2010.01) |
| *H01L 21/683* | (2006.01) |

(52) U.S. Cl.
CPC ........ *H01L 21/67259* (2013.01); *H01L 21/30* (2013.01); *H01L 21/6835* (2013.01); *H01L 31/1856* (2013.01); *H01L 33/26* (2013.01); *H01L 2221/68322* (2013.01); *H01L 2221/68354* (2013.01); *H01L 2221/68381* (2013.01)

(58) Field of Classification Search
CPC ............... H01L 21/67259; H01L 21/30; H01L 21/6835; H01L 2221/68322; H01L 2221/68354; H01L 2221/68381; H01L 33/26; H01L 31/1856

See application file for complete search history.

(56) References Cited

U.S. PATENT DOCUMENTS

| | | | | |
|---|---|---|---|---|
| 4,402,610 | A | * | 9/1983 | Lacombat ............. G03F 9/7049 356/400 |
| 5,152,390 | A | | 10/1992 | Kubota et al. |
| 5,528,372 | A | * | 6/1996 | Kawashima .......... H01L 21/681 356/401 |
| 2008/0258165 | A1 | | 10/2008 | Zimmerman et al. |
| 2011/0132885 | A1 | * | 6/2011 | Sercel ................ B23K 26/0608 219/121.72 |

(Continued)

*Primary Examiner* — Mark W Tornow
(74) *Attorney, Agent, or Firm* — Li & Cai Intellectual Property (USA) Office

(57) ABSTRACT

The present invention provides a position-detecting and chip-separating device applied to a semiconductor structure that includes a base layer and a plurality of light emitting chips disposed on the base layer. The position-detecting and chip-separating device includes a position detecting module and a chip separating module. The position detecting module includes an emitting element and a receiving element, and the chip separating module corresponds to the position detecting module. The position detecting module provides a position data of a contact interface between the base layer and the light emitting chip by pairing of the emitting element and the receiving element. A projection light source generated by the chip separating module is projected onto the contact interface between the base layer and the light emitting chip according to the position data so as to easily separate the light emitting chip from the base layer.

10 Claims, 10 Drawing Sheets

(56) References Cited

U.S. PATENT DOCUMENTS

| | | | |
|---|---|---|---|
| 2011/0159615 A1* | 6/2011 | Lai | H01L 33/0079 |
| | | | 438/29 |
| 2016/0268472 A1 | 9/2016 | Peddada et al. | |
| 2017/0142874 A1* | 5/2017 | Pourchet | H01L 21/6836 |
| 2018/0261582 A1* | 9/2018 | Henry | H01L 25/167 |

* cited by examiner

POSITION-DETECTING AND CHIP-SEPARATING DEVICE

FIELD OF THE INVENTION

The present disclosure relates to a position-detecting and chip-separating device, and more particularly to a position-detecting and chip-separating device applied to a semiconductor structure.

BACKGROUND OF THE INVENTION

In recent years, LEDs (light-emitting diodes) have been widely used due to good light-emitting quality and high light-emitting efficiency. LEDs have been developed to be capable of emitting red, green, and blue light, and LEDs have been increasingly used in various applications such as a full-color LED display, so that color performance of the full-color LED display can be increased. Typically, the red, green, and blue lights respectively generated by the red, green, and blue LEDs blend to form colored light with high brightness and contrast, so as to display information for viewers.

SUMMARY OF THE INVENTION

One aspect of the present disclosure relates to a position-detecting and chip-separating device.

One of the embodiments of the present disclosure provides a position-detecting and chip-separating device applied to a semiconductor structure that includes a base layer and a plurality of light emitting chips disposed on the base layer. The position-detecting and chip-separating device includes a position detecting module and a chip separating module. The position detecting module includes an emitting element and a receiving element, and the chip separating module corresponds to the position detecting module. More particularly, the position detecting module provides a position data of a contact interface between the base layer and the light emitting chip by matching the emitting element and the receiving element. A projection light source generated by the chip separating module is projected onto the contact interface between the base layer and the light emitting chip according to the position data so as to easily separate the light emitting chip from the base layer.

More particularly, the emitting element is a signal emitting element for generating a detection signal, and the receiving element is a signal receiving element for receiving the detection signal. The detection signal generated by the signal emitting element is reflected by the semiconductor structure and projected onto the signal receiving element so as to provide the position data of the contact interface between the base layer and the light emitting chip.

More particularly, the light emitting chips of the semiconductor structure are attached to an adhesive layer of a carrier substrate. The base layer is one of a sapphire base layer and a silicon base layer, and the light emitting chip is a GaN LED chip.

More particularly, the position-detecting and chip-separating device further includes a control module electrically connected to the position detecting module and the chip separating module. The position detecting module is one of an optical position sensor and a sound position sensor, and the position detecting module and the chip separating module are disposed beside the same side or respectively disposed beside two different sides of the semiconductor structure.

Another one of the embodiments of the present disclosure provides a position-detecting and chip-separating device applied to a semiconductor structure that includes a base layer and a plurality of light emitting chips disposed on the base layer. The position-detecting and chip-separating device includes an emitting element for generating a projection light source, and a receiving element adjacent to the emitting element. More particularly, the projection light source generated by the emitting element is reflected by the semiconductor structure and projected onto the receiving element so as to provide a position data of a contact interface between the base layer and the light emitting chip. The projection light source generated by the emitting chip is projected onto the contact interface between the base layer and the light emitting chip according to the position data so as to easily separate the light emitting chip from the base layer.

More particularly, the position-detecting and chip-separating device further includes a first prism adjacent to the emitting element and the receiving element, a second prism adjacent to the first prism, and a signal amplifier adjacent to the first prism. The projection light source generated by the emitting element sequentially passes through the first prism and the second prism and is projected onto the semiconductor structure, the projection light source is reflected by the semiconductor structure to form a reflection light source, and the reflection light source sequentially passes through the second prism and the first prism and is projected onto the receiving element. The projection light source generated by the emitting element sequentially passes through the first prism and the signal amplifier and is projected onto the contact interface between the base layer and the light emitting chip.

More particularly, the position-detecting and chip-separating device further includes a control module electrically connected to the emitting element and the receiving element. The light emitting chips of the semiconductor structure are attached to an adhesive layer of a carrier substrate. The base layer is one of a sapphire base layer and a silicon base layer, and the light emitting chip is a GaN LED chip.

Yet another one of the embodiments of the present disclosure provides a position-detecting and chip-separating device applied to a semiconductor structure that includes a base layer and a plurality of light emitting chips disposed on the base layer. The position-detecting and chip-separating device includes a position detecting module and a chip separating module. The position detecting module is used for contacting the semiconductor structure so as to provide a position data of a contact interface between the base layer and the light emitting chip. The chip separating module corresponds to the position detecting module. More particularly, a projection light source generated by the chip separating module is projected onto the contact interface between the base layer and the light emitting chip according to the position data so as to easily separate the light emitting chip from the base layer.

More particularly, the light emitting chips of the semiconductor structure are attached to an adhesive layer of a carrier substrate. The base layer is one of a sapphire base layer and a silicon base layer, and the light emitting chip is a GaN LED chip.

More particularly, the position-detecting and chip-separating device further includes a control module electrically connected to the position detecting module and the chip separating module. The position detecting module is a contact position sensor, and the position detecting module and the chip separating module are disposed beside the same side or respectively disposed beside two different sides of the semiconductor structure.

Therefore, by matching the features of "the position detecting module being used for providing a position data of a contact interface between the base layer and the light emitting chip" and "a projection light source generated by the chip separating module being projected onto the contact interface between the base layer and the light emitting chip according to the position data", the light emitting chip can be easily separated from the base layer.

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of a position-detecting and chip-separating device according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

First Embodiment

Referring to FIG. 1 to FIG. 4, the first embodiment of the present disclosure provides a position-detecting and chip-separating device that includes a position detecting module 1 and a chip separating module 2. The position-detecting and chip-separating device can be applied to a semiconductor structure S that includes a base layer S1 and a plurality of light emitting chips S2 disposed on the base layer S1. For example, the base layer S1 may be a sapphire base layer, a silicon base layer, or any material base layer. In addition, the light emitting chips S2 can be connected with each other before cutting the light emitting chips S2, or the light emitting chips S2 can be separated from each other after cutting the light emitting chips S2 (as shown in the first embodiment). The light emitting chip S2 may be a GaN LED chip or any type of semiconductor LED chip, and each light emitting chip S2 has at least two pads (not shown) disposed on a top side thereof. However, the base layer S1 and the light emitting chips S2 used in the first embodiment are not meant to limit the scope of the present disclosure.

Figure 1:
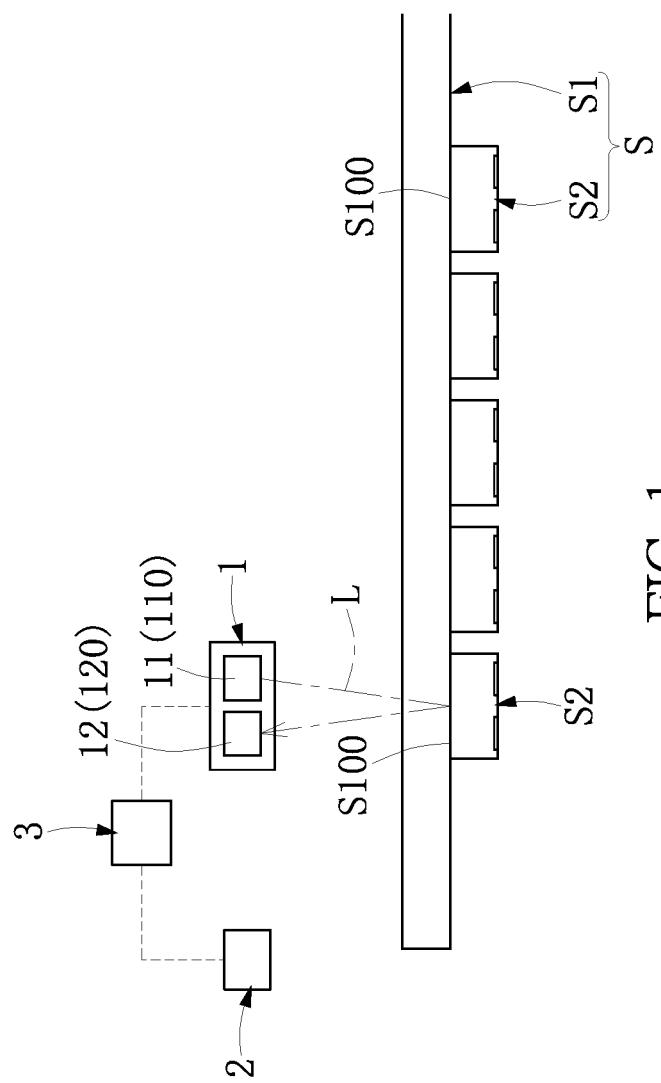
FIG. 1 shows a schematic view of a position-detecting and chip-separating device performing a position detecting step according to a first embodiment of the present disclosure.
Figure 2:
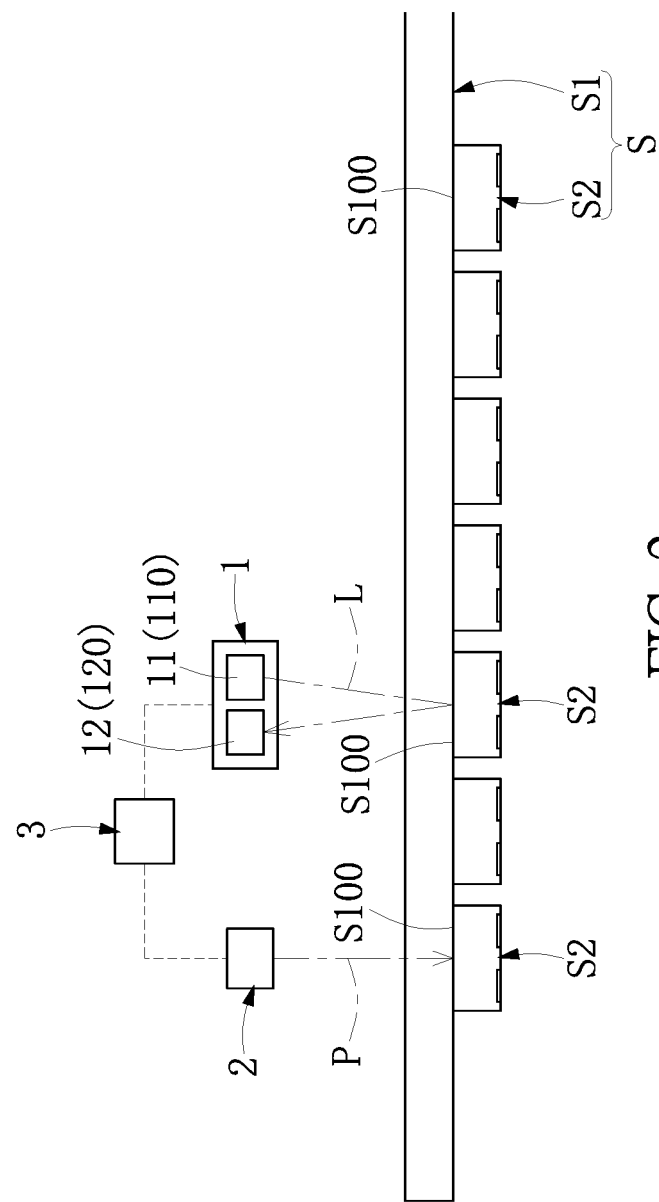
FIG. 2 shows a schematic view of the position-detecting and chip-separating device performing a position detecting step and a chip separating step according to the first embodiment of the present disclosure.

Referring to FIG. 1 and FIG. 2, the position detecting module 1 includes an emitting element 11 and a receiving element 12, and the chip separating module 2 is adjacent to or corresponds to the position detecting module 1. More particularly, the position detecting module 1 can provide a position data of a contact interface S100 (or a contact surface) between the base layer S1 and the light emitting chip S2 by matching the emitting element 11 and the receiving element 12 (that is to say, the position detecting module 1 can be used to perform or execute a position detecting step). Therefore, referring to FIG. 2 and FIG. 3, a projection light source P generated by the chip separating module 2 is projected onto the contact interface S100 between the base layer S1 and the light emitting chip S2 according to the position data so as to easily separate the light emitting chip S2 from the base layer S1 (that is to say, the chip separating module 2 can be used to perform a position separating step). Hence, after the projection light source P is projected onto the semiconductor structure S, the light emitting chip S2 can be easily separated from the base layer S1 due to the illumination of the projection light source P.

For example, referring to FIG. 1 and FIG. 2, the position detecting module 1 may be one of an optical position sensor and a sound position sensor. More particularly, the emitting element 11 may be a signal emitting element 110 (such as a signal emitter) for generating a detection signal L (such as an optical wave signal or a sound wave signal), and the receiving element 12 may be a signal receiving element 120 (such as a signal receiver) for receiving the detection signal L. In addition, the detection signal L generated by the signal emitting element 110 can be reflected by the semiconductor structure S and can be projected onto the signal receiving element 120 so as to provide a position data (or a position signal) of the contact interface S100 between the base layer S1 and the light emitting chip S2. Hence, referring to FIG. 2 and FIG. 3, the projection light source P generated by the chip separating module 2 can be projected onto the contact interface S100 between the base layer S1 and the light emitting chip S2 according to the position data that has been received by the signal receiving element 120, so that the light emitting chip S2 can be easily separated from the base layer S1 due to the illumination of the projection light source P.

In conclusion, the position detecting module 1 can be used to provide a position data of a contact interface S100 between the base layer S1 and the light emitting chip S2 by matching or pairing the emitting element 11 and the receiving element 12 in advance, and then a projection light source P generated by the chip separating module 2 can be precisely projected onto the contact interface S100 between the base layer S1 and the light emitting chip S2 according to the position data. Hence, the light emitting chip S2 can be easily separated from the base layer S1 due to the illumination of the projection light source P.

Figure 3:
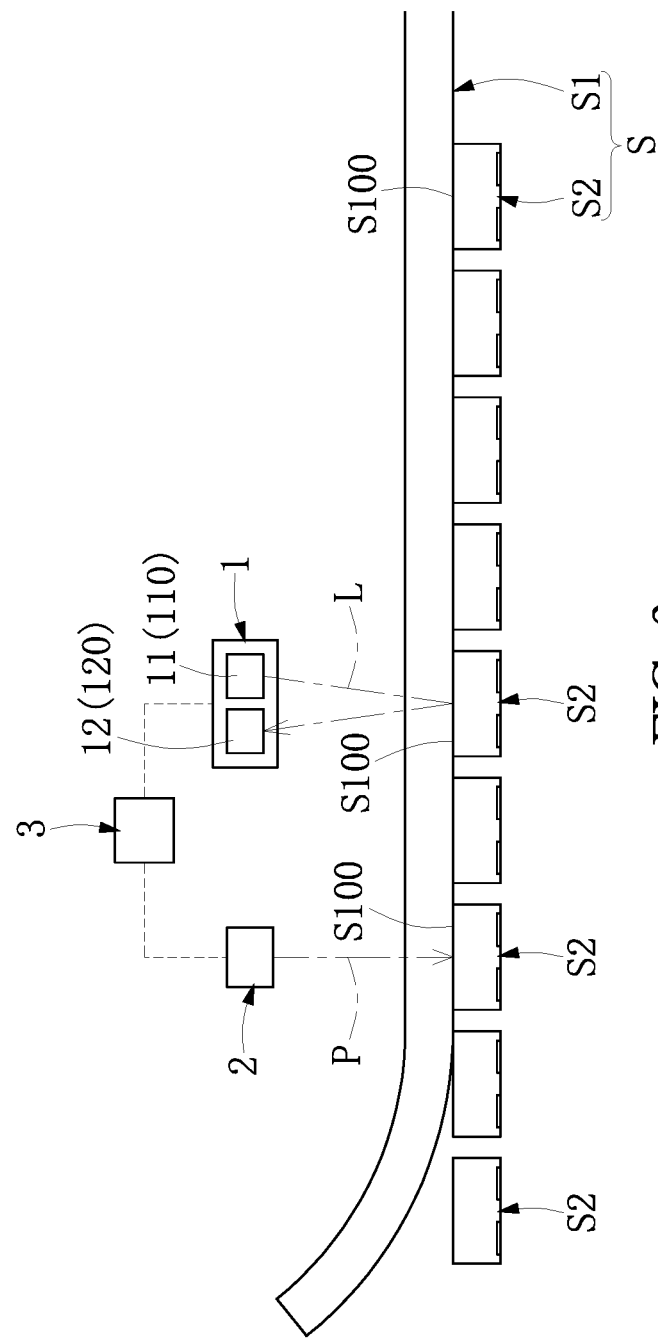
FIG. 3 shows a schematic view of one of a plurality of light emitting chips being separated from a base layer according to the first embodiment of the present disclosure.
Figure 4:
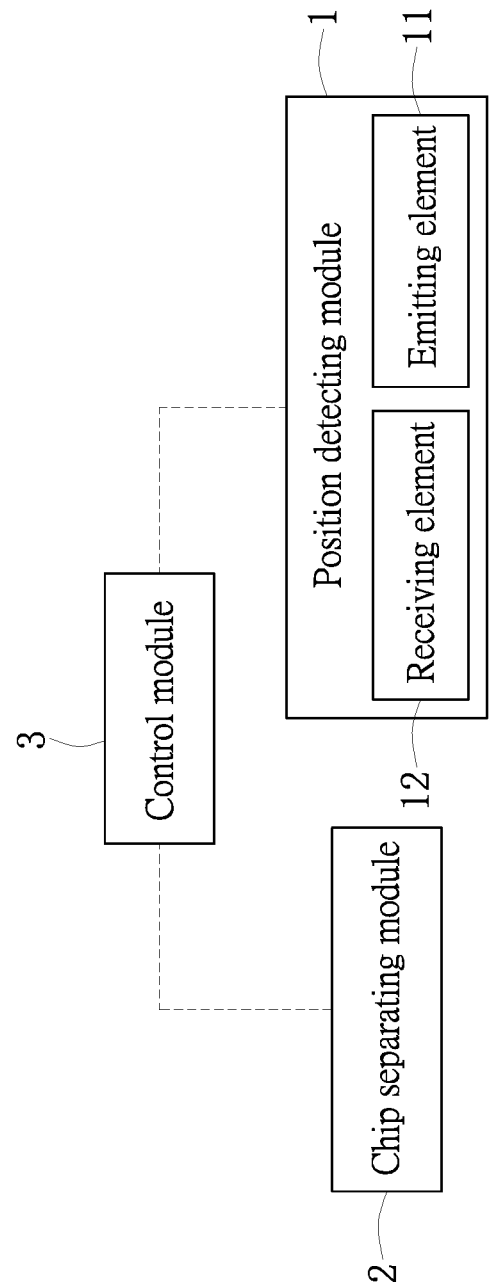
FIG. 4 shows a function block of the position-detecting and chip-separating device according to the first embodiment of the present disclosure.

It should be noted that the position-detecting and chip-separating device of the present disclosure further includes a control module 3 electrically connected to the position detecting module 1 and the chip separating module 2 as shown in FIG. 1 and FIG. 3. In addition, referring to FIG. 1 to FIG. 3, the position detecting module 1 and the chip separating module 2 can be disposed beside or on the same side of the semiconductor structure S.

Second Embodiment

Figure 5:
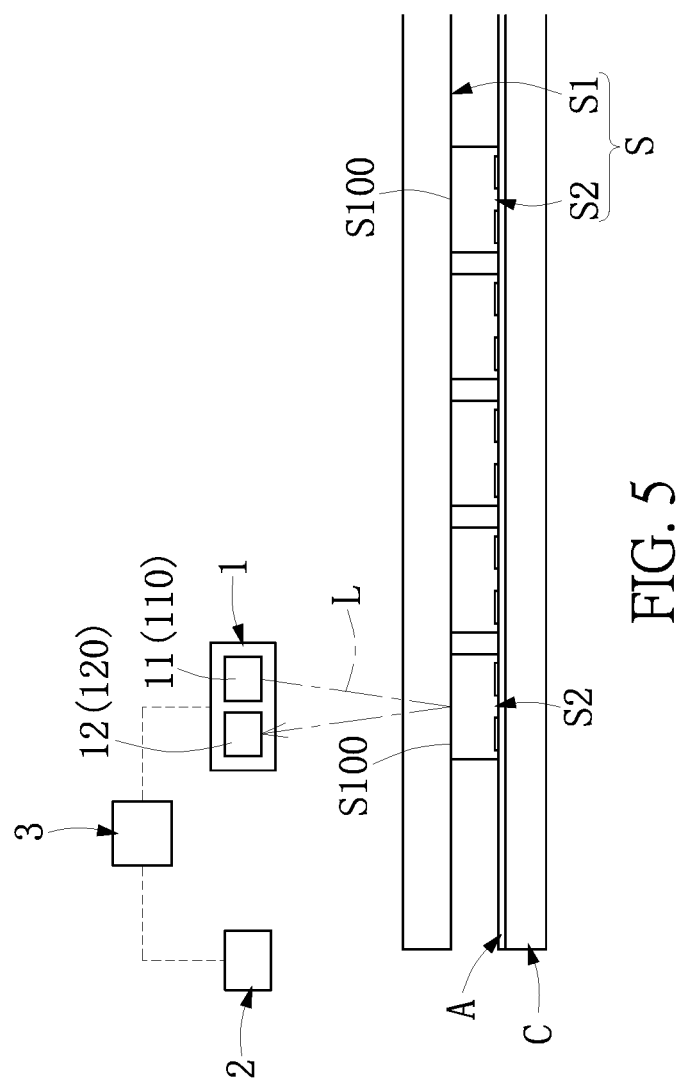
FIG. 5 shows a schematic view of a position-detecting and chip-separating device performing a position detecting step according to a second embodiment of the present disclosure.
Figure 6:
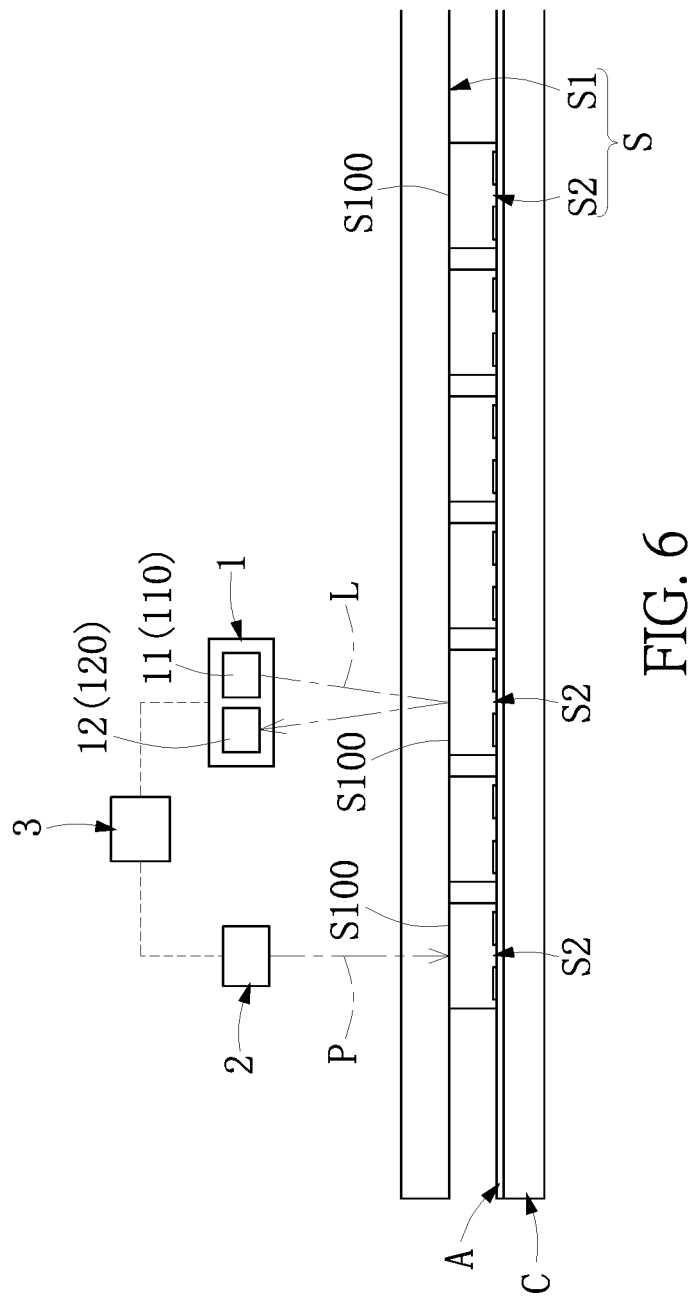
FIG. 6 shows a schematic view of the position-detecting and chip-separating device performing a position detecting step and a chip separating step according to the second embodiment of the present disclosure.
Figure 7:
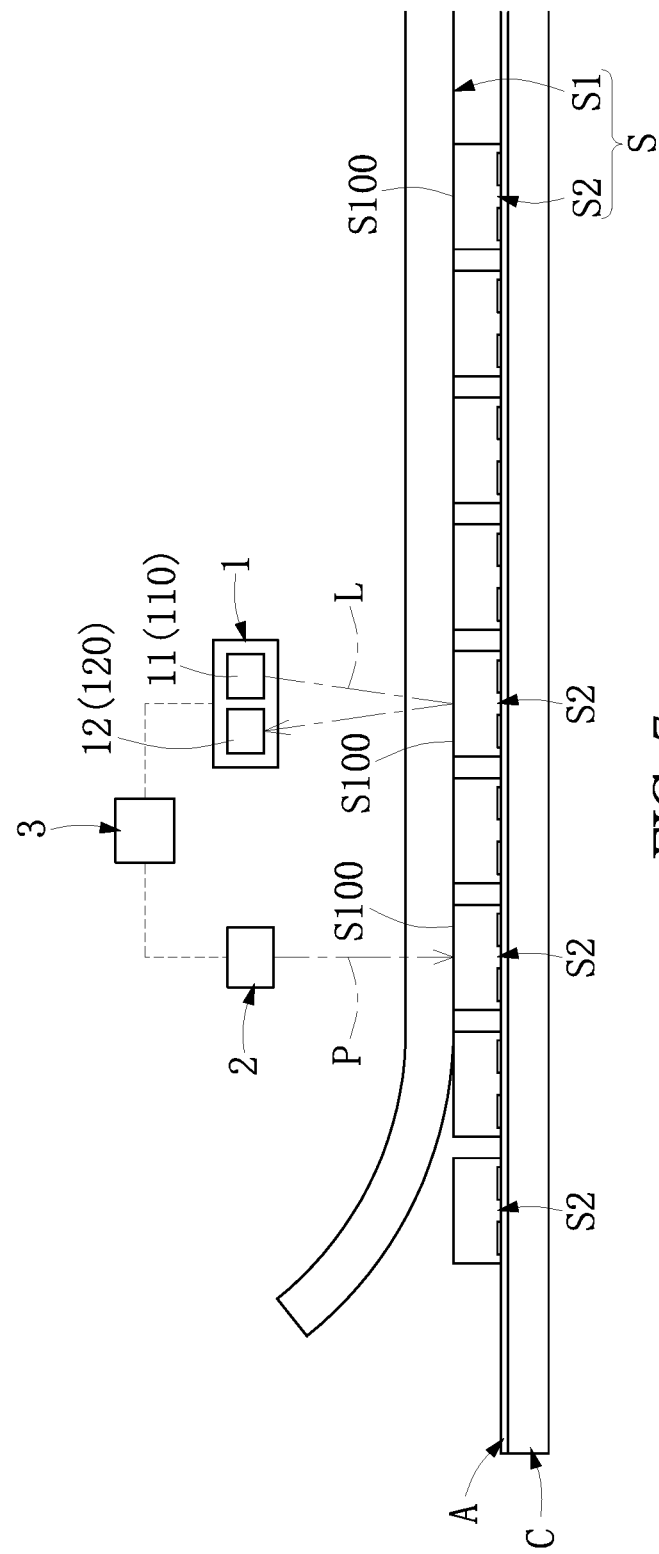
FIG. 7 shows a schematic view of one of a plurality of light emitting chips being separated from a base layer according to the second embodiment of the present disclosure.

Referring to FIG. 5 to FIG. 7, the second embodiment of the present disclosure provides a position-detecting and chip-separating device that includes a position detecting module 1 and a chip separating module 2. Comparing FIG. 5 with FIG. 1, FIG. 6 with FIG. 2, and FIG. 7 with FIG. 3, the difference between the second embodiment and the first embodiment is as follows: in the second embodiment, the light emitting chips S2 of the semiconductor structure S can be attached to an adhesive layer A of a carrier substrate C in advance, and then at least two pads (not shown) of the light emitting chip 2 can contact the adhesive layer A. Hence, when the light emitting chips S2 are separated from the base layer S1, the light emitting chips S2 can still be attached to the adhesive layer A of the carrier substrate C according to the original arrangement of the light emitting chips S2.

For example, the carrier substrate C and the adhesive layer A may be made of transparent material or opaque material.

Third Embodiment

Figure 8:
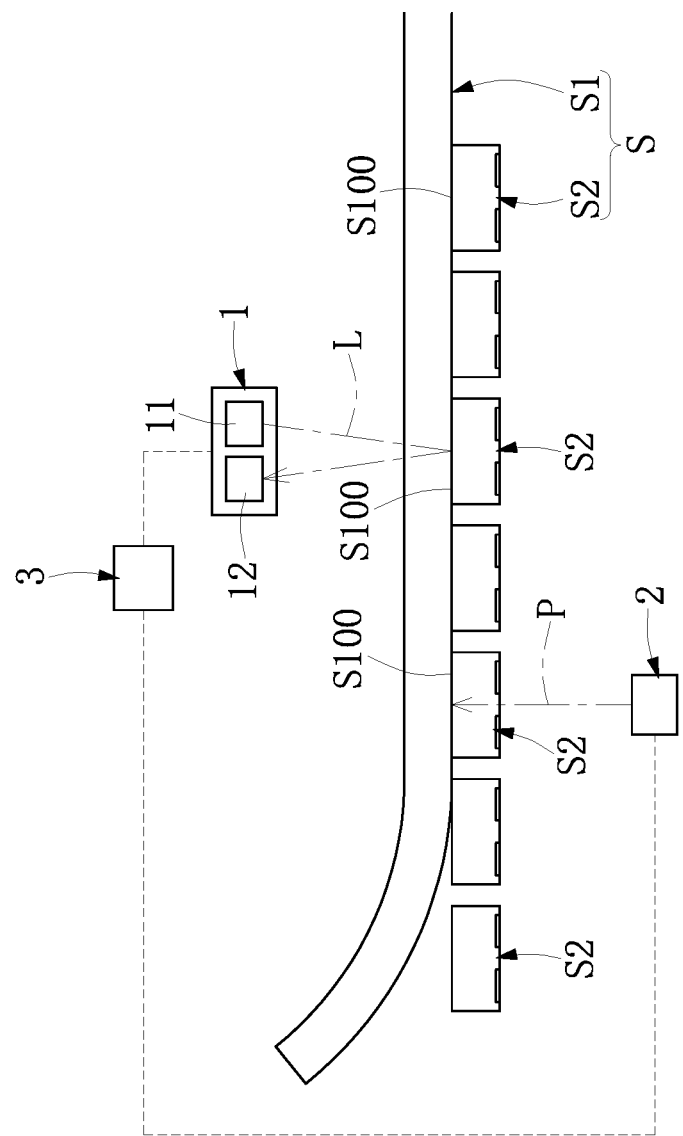
FIG. 8 shows a schematic view of the position-detecting and chip-separating device performing a position detecting step and a chip separating step according to a third embodiment of the present disclosure.

Referring to FIG. 8, the third embodiment of the present disclosure provides a position-detecting and chip-separating device that includes a position detecting module 1 and a chip separating module 2. Comparing FIG. 8 with FIG. 3, the difference between the third embodiment and the first embodiment is as follows: in the third embodiment, the position detecting module 1 and the chip separating module 2 can be respectively disposed beside or at two different sides of the semiconductor structure S. For example, the position detecting module 1 can be disposed above the semiconductor structure S, and the chip separating module 2 can be disposed under the semiconductor structure S.

It should be noted that the light emitting chip S2 can also be respectively detected and separated on the same position. That is to say, the position detecting module 1 and the chip separating module 2 can be respectively disposed beside or at two different sides of the semiconductor structure S, so that the light emitting chip S2 can be respectively detected and separated on the same position, as shown in FIG. 8.

It should be noted that the light emitting chips S2 of the semiconductor structure S of the fourth embodiment can also be attached to an adhesive layer A of a carrier substrate C in advance, as shown in FIG. 5.

Fourth Embodiment

Figure 9:
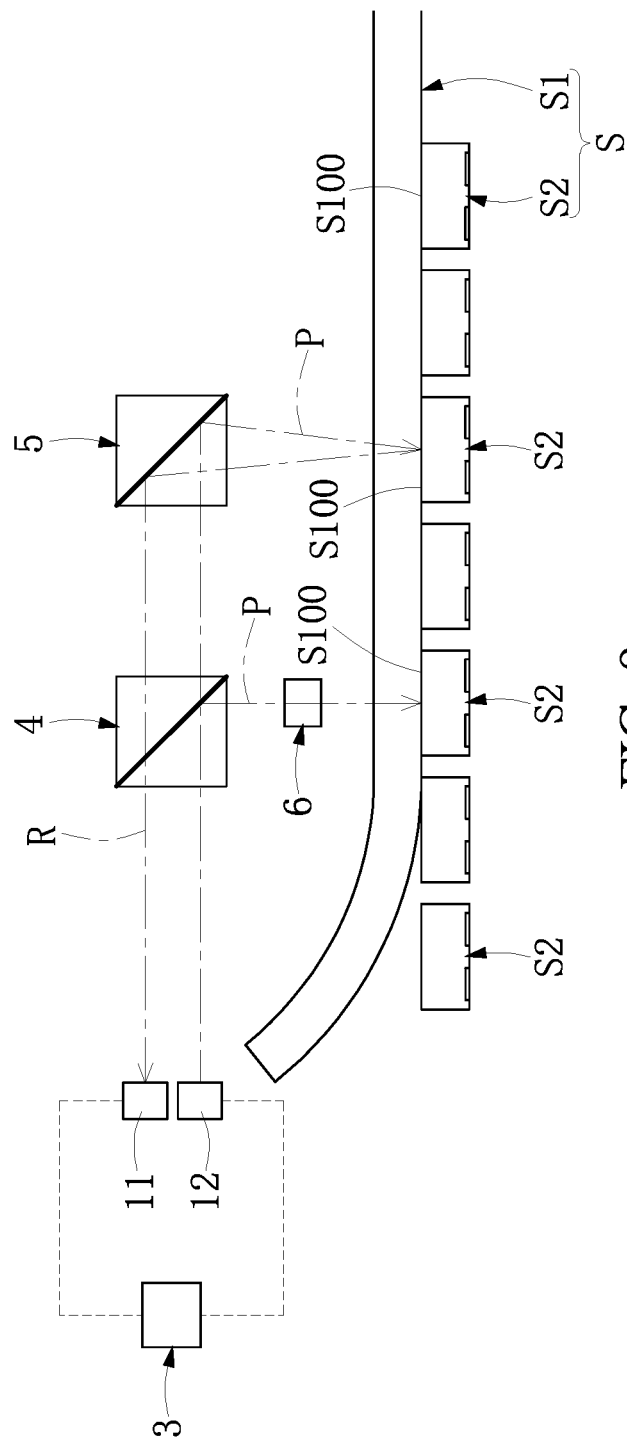
FIG. 9 shows a schematic view of the position-detecting and chip-separating device performing a position detecting step and a chip separating step according to a fourth embodiment of the present disclosure.

Referring to FIG. 9, the fourth embodiment of the present disclosure provides a position-detecting and chip-separating device. Comparing FIG. 9 with FIG. 3, the difference between the fourth embodiment and the first embodiment is as follows: the position-detecting and chip-separating device of the fourth embodiment includes an emitting element 11 for generating a projection light source P, a receiving element 12 adjacent to the emitting element 11, and a control module 3 electrically connected to the emitting element 11 and the receiving element 12.

More particularly, the projection light source P generated by the emitting element 11 can be reflected by the semiconductor structure S and can then be projected onto the receiving element 12 so as to provide a position data of a contact interface S100 between the base layer S1 and the light emitting chip S2. Therefore, according to the position data, the projection light source P generated by the emitting chip 11 can be precisely projected onto the contact interface S100 between the base layer S1 and the light emitting chip S2 so as to easily separate the light emitting chip S2 from the base layer S1.

More particularly, the position-detecting and chip-separating device further includes a first prism 1 adjacent to the emitting element 11 and the receiving element 12, a second prism 5 adjacent to the first prism 4, and a signal amplifier 6 adjacent to the first prism 4. In addition, the projection light source P generated by the emitting element 11 can sequentially pass the first prism 4 and the second prism 5 and can then be projected onto the semiconductor structure S. The projection light source P can be reflected by the semiconductor structure S to form a reflection light source R, and the reflection light source R can sequentially pass through the second prism 5 and the first prism 4 and then be projected onto the receiving element 12. That is to say, the projection light source P generated by the emitting element 11 can be reflected by the semiconductor structure S and can then be projected onto the receiving element 12. Therefore, according to the position data, the projection light source P generated by the emitting element 11 can sequentially pass the first prism 4 and the signal amplifier 6 and can then be precisely projected onto the contact interface S100 between the base layer S1 and the light emitting chip S2, so that the light emitting chip S2 can be easily separated from the base layer S1 due to the illumination of the projection light source P.

It should be noted that the light emitting chips S2 of the semiconductor structure S of the fourth embodiment can also be attached to an adhesive layer A of a carrier substrate C in advance as shown in FIG. 5.

Fifth Embodiment

Figure 10:
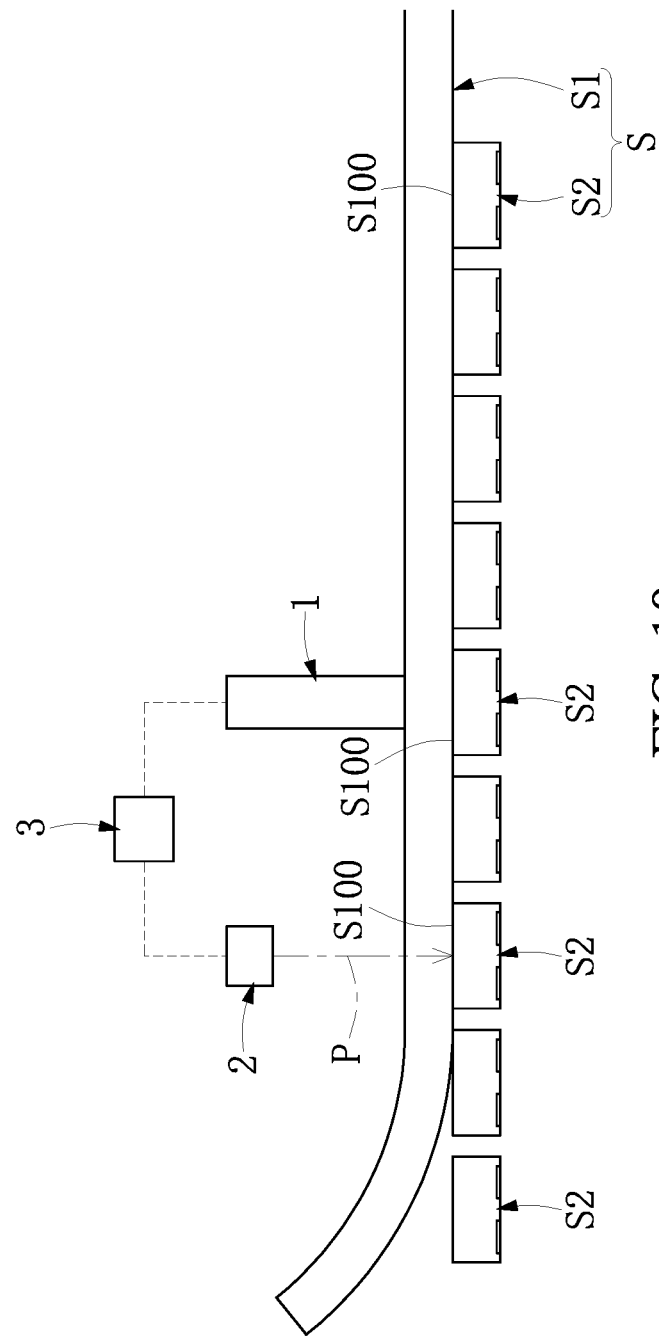
FIG. 10 shows a schematic view of the position-detecting and chip-separating device performing a position detecting step and a chip separating step according to a fifth embodiment of the present disclosure.

Referring to FIG. 10, the fifth embodiment of the present disclosure provides a position-detecting and chip-separating device that includes a position detecting module 1 and a chip separating module 2. Comparing FIG. 10 with FIG. 3, the difference between the fifth embodiment and the first embodiment is as follows: in the fifth embodiment, the position-detecting and chip-separating device includes a position detecting module 1, a chip separating module 2, and a control module 3, and the position detecting module 1 may be a contact position sensor.

More particularly, the position detecting module 1 can contact the semiconductor structure S so as to provide a position data of a contact interface S100 between the base layer S1 and the light emitting chip S2. For example, when the base layer S1 causes warpage, the position detecting module 1 can be used to contact the base layer S1 of the semiconductor structure S so as to know a position of a contact interface S100 between the base layer S1 and the light emitting chip S2. In addition, the chip separating module 2 is adjacent to and corresponds to the position detecting module 1, and the control module 3 is electrically connected to the position detecting module 1 and the chip separating module 2.

Therefore, a projection light source P generated by the chip separating module 2 can be projected onto the contact interface S100 between the base layer S1 and the light emitting chip S2 according to the position data so as to easily separate the light emitting chip S2 from the base layer S1.

It should be noted that the position detecting module 1 and the chip separating module 2 can be disposed beside or on the same side of the semiconductor structure S1 (as shown in FIG. 10), or the position detecting module 1 and the chip separating module 2 can be respectively disposed beside or at two different sides of the semiconductor structure S1, according to different requirements.

It should be noted that the light emitting chips S2 of the semiconductor structure S of the fifth embodiment can be attached to an adhesive layer A of a carrier substrate C in advance, as shown in FIG. 5.

Therefore, by matching the features of "the position detecting module 1 being used for providing a position data of a contact interface S100 between the base layer S1 and the light emitting chip S2" and "a projection light source P generated by the chip separating module 2 being projected onto the contact interface S100 between the base layer S1 and the light emitting chip S2 according to the position data", the light emitting chip S2 of the present disclosure can be easily separated from the base layer S1.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A position-detecting and chip-separating device applied to a semiconductor structure that includes a base layer and a plurality of light emitting chips disposed on the base layer, comprising:
   a position detecting module including an emitting element and a receiving element; and
   a chip separating module corresponding to the position detecting module;
   wherein the position detecting module provides a position data of a contact interface between the base layer and the light emitting chip by matching the emitting element and the receiving element;
   wherein a projection light source generated by the chip separating module is projected onto the contact interface between the base layer and the light emitting chip according to the position data so as to easily separate the light emitting chip from the base layer.

2. The position-detecting and chip-separating device of claim 1, wherein the emitting element is a signal emitting element for generating a detection signal, and the receiving element is a signal receiving element for receiving the detection signal, wherein the detection signal generated by the signal emitting element is reflected by the semiconductor structure and projected onto the signal receiving element so as to provide the position data of the contact interface between the base layer and the light emitting chip.

3. The position-detecting and chip-separating device of claim 1, wherein the light emitting chips of the semiconductor structure are attached to an adhesive layer of a carrier substrate, wherein the base layer is one of a sapphire base layer and a silicon base layer, and the light emitting chip is a GaN LED chip.

4. The position-detecting and chip-separating device of claim 1, further comprising: a control module electrically connected to the position detecting module and the chip separating module, wherein the position detecting module is one of an optical position sensor and a sound position sensor, and the position detecting module and the chip separating module are disposed on the same side or respectively disposed at two different sides of the semiconductor structure.

5. A position-detecting and chip-separating device applied to a semiconductor structure that includes a base layer and a plurality of light emitting chips disposed on the base layer, comprising:
   an emitting element for generating a projection light source; and
   a receiving element adjacent to the emitting element;
   wherein the projection light source generated by the emitting element is reflected by the semiconductor structure and projected onto the receiving element so as to provide a position data of a contact interface between the base layer and the light emitting chip;
   wherein the projection light source generated by the emitting chip is projected onto the contact interface between the base layer and the light emitting chip according to the position data so as to easily separate the light emitting chip from the base layer.

6. The position-detecting and chip-separating device of claim 5, further comprising:
   a first prism adjacent to the emitting element and the receiving element;
   a second prism adjacent to the first prism; and
   a signal amplifier adjacent to the first prism;
   wherein the projection light source generated by the emitting element sequentially passes through the first prism and the second prism and is projected onto the semiconductor structure, the projection light source is reflected by the semiconductor structure to form a reflection light source, and the reflection light source sequentially passes through the second prism and the first prism and is projected onto the receiving element;

wherein the projection light source generated by the emitting element sequentially passes through the first prism and the signal amplifier and is projected onto the contact interface between the base layer and the light emitting chip.

7. The position-detecting and chip-separating device of claim 5, further comprising: a control module electrically connected to the emitting element and the receiving element, wherein the light emitting chips of the semiconductor structure are attached to an adhesive layer of a carrier substrate, wherein the base layer is one of a sapphire base layer and a silicon base layer, and the light emitting chip is a GaN LED chip.

8. A position-detecting and chip-separating device applied to a semiconductor structure that includes a base layer and a plurality of light emitting chips disposed on the base layer, comprising:

a position detecting module contacting the semiconductor structure so as to provide a position data of a contact interface between the base layer and the light emitting chip; and a chip separating module corresponding to the position detecting module;

wherein a projection light source generated by the chip separating module is projected onto the contact interface between the base layer and the light emitting chip according to the position data so as to easily separate the light emitting chip from the base layer.

9. The position-detecting and chip-separating device of claim 8, wherein the light emitting chips of the semiconductor structure are attached to an adhesive layer of a carrier substrate, wherein the base layer is one of a sapphire base layer and a silicon base layer, and the light emitting chip is a GaN LED chip.

10. The position-detecting and chip-separating device of claim 8, further comprising: a control module electrically connected to the position detecting module and the chip separating module, wherein the position detecting module is a contact position sensor, and the position detecting module and the chip separating module are disposed on the same side or respectively disposed at two different sides of the semiconductor structure.

* * * * *